United States Patent [19]

Masuda

[11] Patent Number: 6,107,670
[45] Date of Patent: *Aug. 22, 2000

[54] CONTACT STRUCTURE OF SEMICONDUCTOR DEVICE

[75] Inventor: Kazunori Masuda, Yokohama, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/919,473

[22] Filed: Aug. 28, 1997

[30] Foreign Application Priority Data

Aug. 29, 1996 [JP] Japan .................................. 8-228256

[51] Int. Cl.$^7$ ...................... H01L 29/788; H01L 21/762; H01L 29/51

[52] U.S. Cl. ...................... 257/510; 257/315; 257/640; 257/760

[58] Field of Search .................................. 257/315, 510, 257/640, 760

[56] References Cited

U.S. PATENT DOCUMENTS

| | | | |
|---|---|---|---|
| 5,324,974 | 6/1994 | Liao | 257/640 |
| 5,734,607 | 3/1998 | Sung | 257/315 |

*Primary Examiner*—Jerome Jackson, Jr.
*Attorney, Agent, or Firm*—Banner & Witcoof, Ltd.

[57] ABSTRACT

Disclosed is a contact structure between the bit line and the source/drain region in an EEPROM. An element region is isolated by a trench type element isolation region in a silicon substrate. The source/drain region is formed in the portion of the element region, that is surrounded by the trench type element isolation region and a multilayered gate. A silicon nitride film covers the surface of the trench type element isolation region and that of the multilayered gate, and an interlevel insulating film made from silicon dioxide is formed. A contact hole is formed in the interlevel insulating film. The source/drain region and the silicon nitride film are exposed in the contact hole. A bit line is connected to the source/drain region through the contact hole.

29 Claims, 13 Drawing Sheets

CONTACT STRUCTURE OF SEMICONDUCTOR DEVICE

BACKGROUND OF THE INVENTION

The present invention relates to formation of contact holes of a semiconductor device.

Figure 1A:
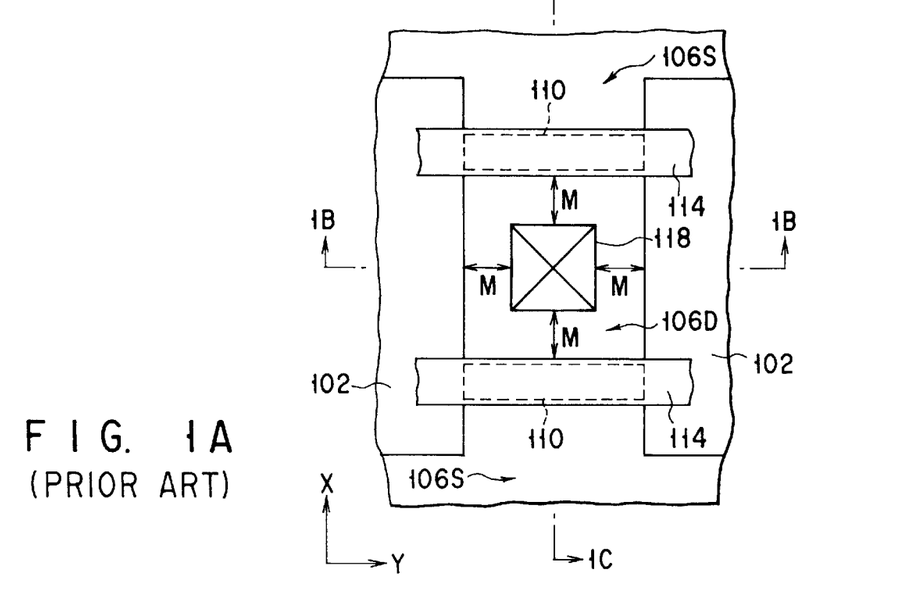
FIG. 1A is a plan view of the memory cell array of a conventional EEPROM.
Figure 1B:
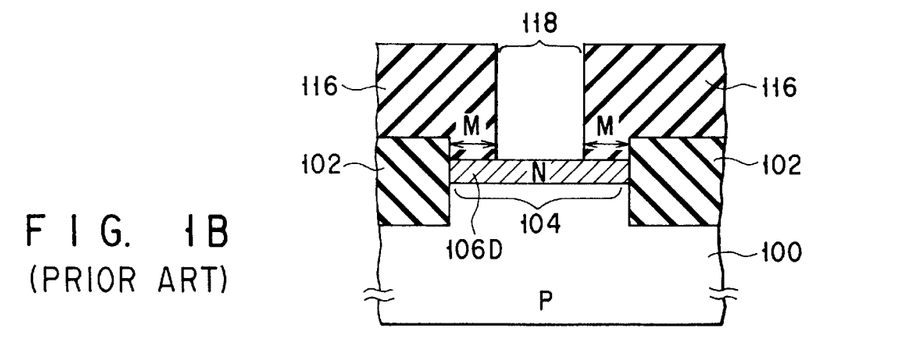
FIG. 1B is a sectional view taken along the line 1B—1B in FIG. 1A.
Figure 1C:
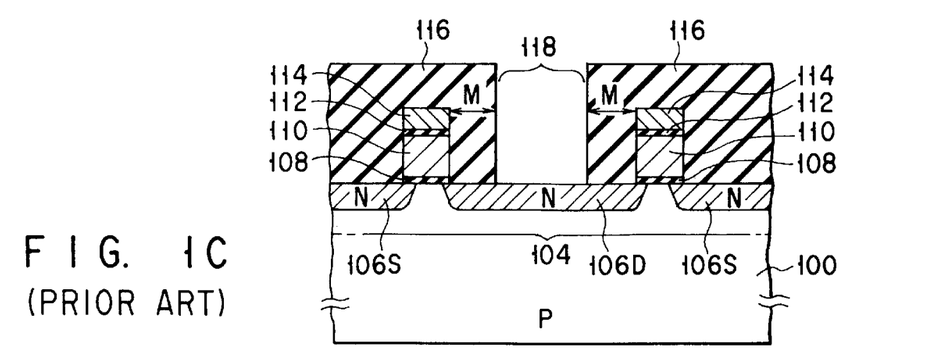
FIG. 1C is a sectional view taken along the line 1C—1C in FIG. 1A.

FIG. 1A is a plan view of the memory cell array of a conventional EEPROM, FIG. 1B is a sectional view taken along the line 1B—1B in FIG. 1A, and FIG. 1C is a sectional view taken along the line 1C—1C in FIG. 1A.

As shown in FIGS. 1A to 1C, element isolation regions 102 made from silicon dioxide are formed in a p-type silicon substrate 100. The element isolation regions 102 define an element region 104 in the substrate 100. In the element region 104, n-type source and drain 106S and 106D are formed. A floating gate 110 is formed on the substrate 100 between the source and drain 106S and 106D via a tunnel oxide film ($SiO_2$) 108. A control gate (word line) 114 capacitively coupled to the floating gate 110 is formed on the floating gate 110 via an insulating film 112. An interlevel insulating film 116 made from silicon dioxide is formed on the substrate 100. A contact hole 118 is formed in the interlevel insulating film 116 to reach with the drain 106D. On the interlevel insulating film 116, a bit line will be formed to be connected to the drain 106D through the contact hole 118.

In the memory cell array having the above arrangement, if the contact hole 118 is formed to overlap the element isolation region 102 or the control gate 114, the bit line short-circuits with the substrate 100, or the control and floating gates 114 and 110.

Figure 2A:
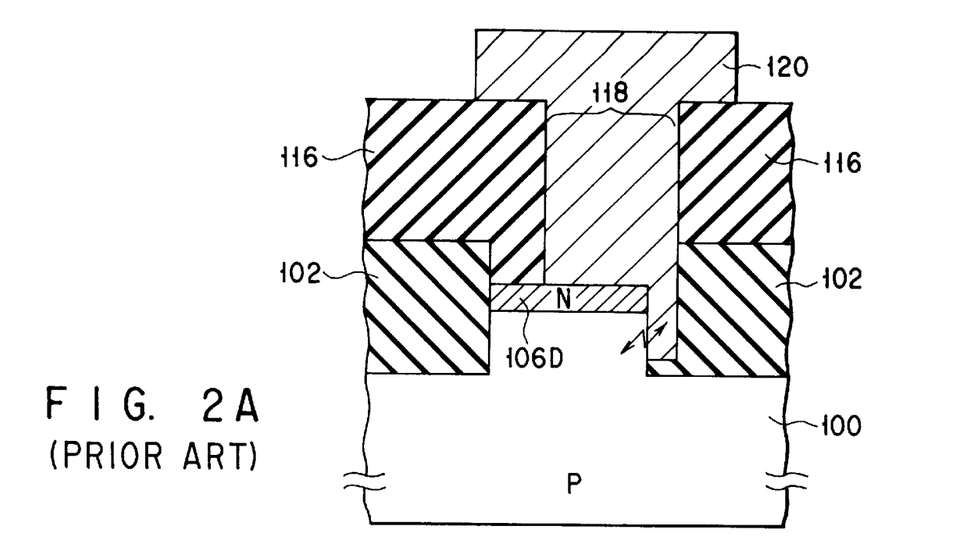
FIG. 2A is a sectional view showing a short circuit between a bit line and a substrate.
Figure 2B:
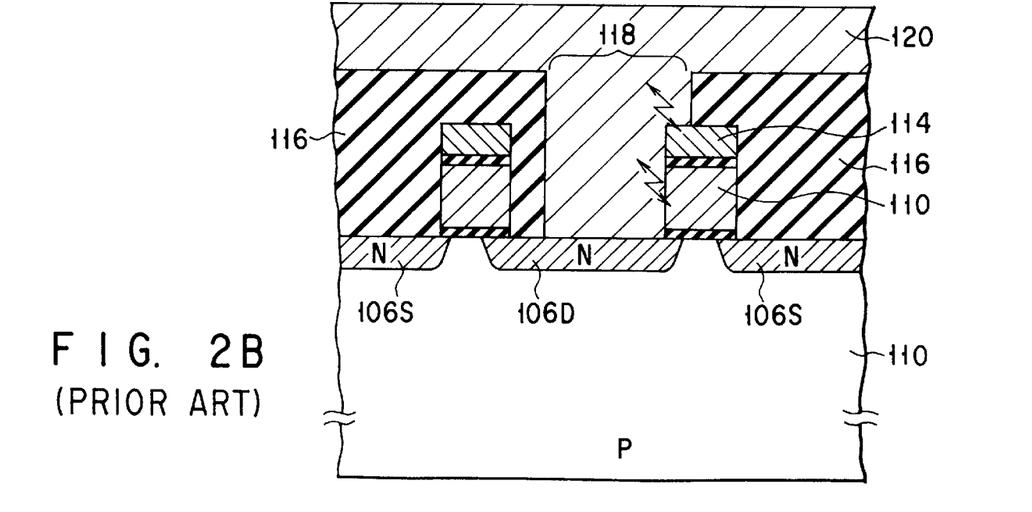
FIG. 2B is a sectional view showing a short circuit between the bit line and a control gate/floating gate.

FIG. 2A is a sectional view showing a short circuit between the bit line and the substrate, and FIG. 2B is a sectional view showing a short circuit between the bit line and the control/floating gate.

As shown in FIG. 2A, if the contact hole 118 is formed to overlap the element isolation region 102, the element isolation region 102 is etched. This is because both the element isolation region 102 and the interlevel insulating film 116 are made from silicon dioxide, and the etchant that etches the interlevel insulating film 116 also etches the element isolation region 102. If the element isolation region 102 is etched to the substrate 100 below the drain 106D, the substrate 100 is exposed in the contact hole 118.

As shown in FIG. 2B, if the contact hole 118 is formed to overlap the control gate 114, the control and floating gates 114 and 110 are exposed in the contact hole 118. As a result, a bit line 120 short-circuits with the control and floating gates 114 and 110.

To avoid the short circuits shown in FIGS. 2A and 2B, the contact hole 118 is formed with margins M in the X direction (margins for the control gate 114) and the Y direction (margins for the element isolation region 102) in advance (FIGS. 1A to 1C). The size of the margin M is determined in consideration of a misalignment in mask alignment, a processing size error in etching, and the like.

BRIEF SUMMARY OF THE INVENTION

As described above, the conventional memory cell array structure requires the margin M for the contact hole 118 to prevent a further shrink in feature size of the memory cell array.

Particularly, the short mode shown in FIG. 2A which occurs when the contact hole 118 is formed to overlap the element isolation region 102 is traced to the progress of shallowing of a diffusion layer. To avoid this short mode, with the state-of-the-art technology, the margin M must be set between the contact hole 118 and the element isolation region 102.

The present invention has been made in consideration of the above situations, and has as its object to provide a semiconductor device in which the short mode that occurs when a contact hole overlaps an element isolation region can be avoided without setting any margin between the contact hole and the element isolation region, and a method of manufacturing the same.

It is another object of the present invention to provide a nonvolatile semiconductor memory device having a memory cell array in which a contact hole can be formed without setting margins in the X and Y directions, thereby realizing a further shrink in feature size.

To achieve the above objects, according to the present invention, the surface of an element isolation region for isolating an element region is covered with an insulator different from the element isolation region and an interlevel insulating film.

In the present invention, even if a contact hole reaching a semiconductor active region (source/drain region) formed in the element region is formed in the interlevel insulating film to overlap the element isolation region, the element isolation region is hardly etched because the insulator different from the interlevel insulating film serves as an etching barrier. With this arrangement, no hole reaching the substrate below the semiconductor active region is formed in the element isolation region. Therefore, an interconnect formed in the contact hole does not short-circuit with the substrate.

The contact hole can also be formed large enough to overlap the interlevel insulating film.

To achieve another object, according to the present invention, the surface of a gate electrode is covered with an insulator different from the interlevel insulating film.

According to the present invention, in forming the contact hole in the interlevel insulating film, even if the contact hole is formed to overlap the gate electrode, the gate electrode is not exposed in the contact hole because the insulator different from the interlevel insulating film serves as an etching barrier. Therefore, the interconnect formed in the contact hole short-circuits with neither the substrate nor the gate electrode.

The contact hole can also be formed large enough to overlap both the interlevel insulating film and the gate electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be described below.

Figure 3A:
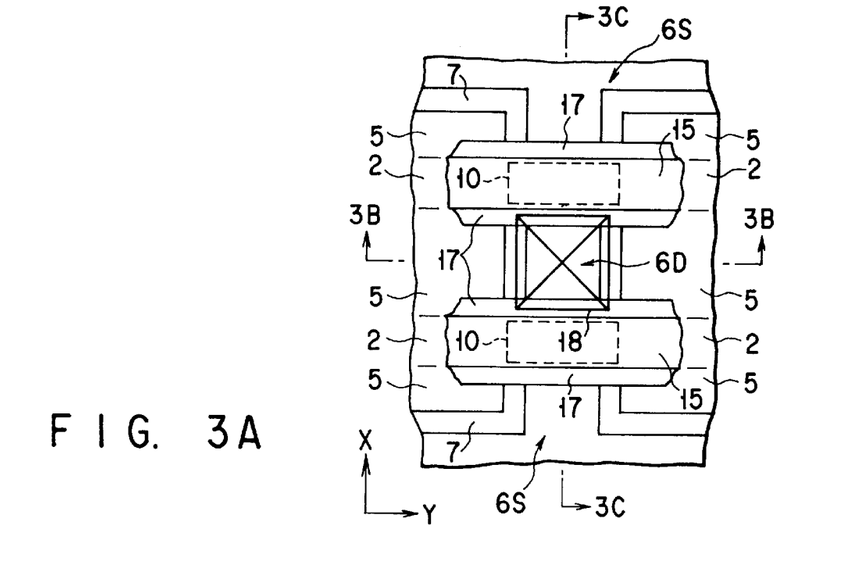
FIG. 3A is a plan view of the memory cell array of an EEPROM according to an embodiment of the present invention.
Figure 3B:
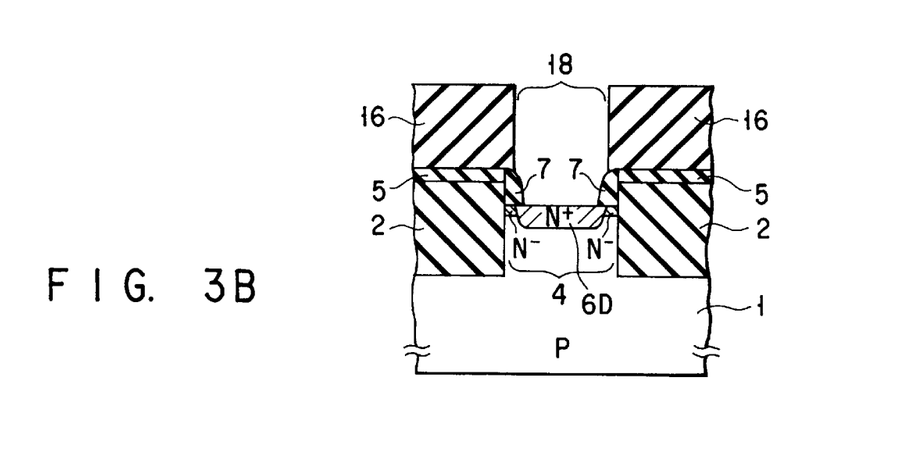
FIG. 3B is a sectional view taken along the line 3B—3B in FIG. 3A.
Figure 3C:
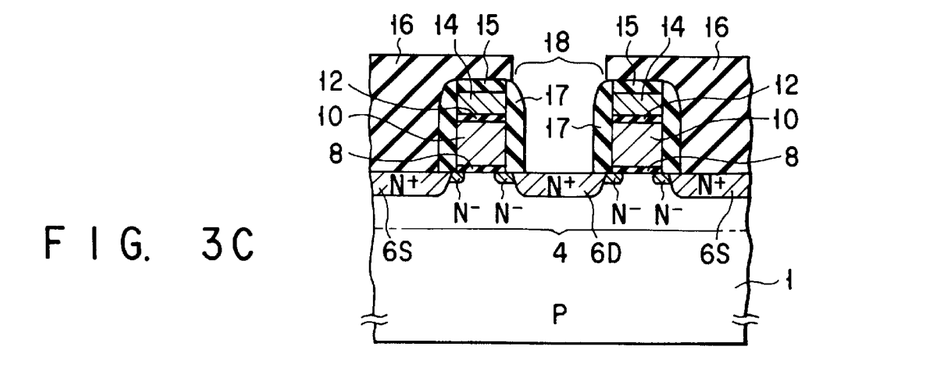
FIG. 3C is a sectional view taken along the line 3C—3C in FIG. 3A.

FIG. 3A is a plan view of the memory cell array of an EEPROM according to an embodiment of the present invention, FIG. 3B is a sectional view taken along the line 3B—3B in FIG. 3A, and FIG. 3C is a sectional view taken along the line 3C—3C in FIG. 3A.

As shown in FIGS. 3A to 3C, element isolation regions 2 made from silicon dioxide are formed in a p-type silicon substrate 1. The element isolation regions 2 define an element region 4 in the substrate 1. Each element isolation region 2 projects from the surface of the substrate 1. A nitride film 5 made from silicon nitride ($Si_3N_4$) is formed on the element isolation region 2 except for a region where a control gate (word line) will be formed. A side wall nitride film 7 made from silicon nitride ($Si_3N_4$) is formed on the side wall of the projecting portion of the element isolation region 2 and the side wall of the nitride film 5. N-type source and drain regions 6S and 6D are formed in the element region 4 of the substrate 1. A floating gate 10 made from conductive polysilicon is formed on the substrate 1 between the source and drain regions 6S and 6D via a tunnel insulating film 8 made from silicon dioxide ($SiO_2$). A control gate (word line) 14 capacitively coupled to the floating gate 10 is formed on the floating gate 10 via an insulating film 12 constituted by three, silicon dioxide ($SiO_2$)/silicon nitride ($Si_3N_4$)/silicon dioxide ($SiO_2$) layers. A nitride film 15 made from silicon nitride ($Si_3N_4$) is formed on the control gate 14. A side wall nitride film 17 made from silicon nitride ($Si_3N_4$) is formed on the side wall of the multilayered structure constituted by the tunnel oxide film 8, the floating gate 10, the insulating film 12, the control gate 14, and the nitride film 15. An interlevel insulating film 16 made from silicon dioxide is formed on the substrate 1. A contact hole 18 is formed in the interlevel insulating film 16 to reach the drain region 6D. On the interlevel insulating film 16, a bit line will be formed to be connected to the drain 6D through the contact hole 18.

Figure 4A:
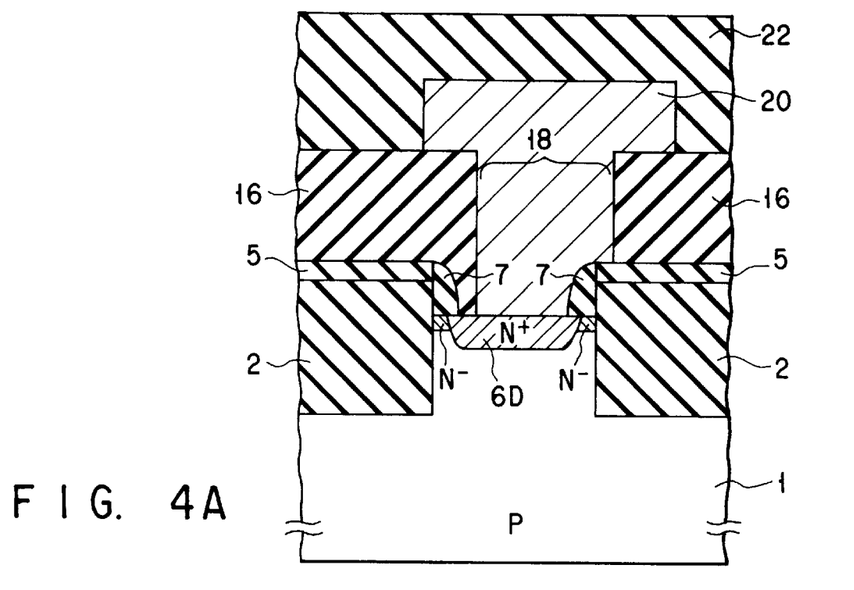
FIG. 4A is a sectional view showing a state wherein a contact hole is formed to overlap an element isolation region.
Figure 4B:
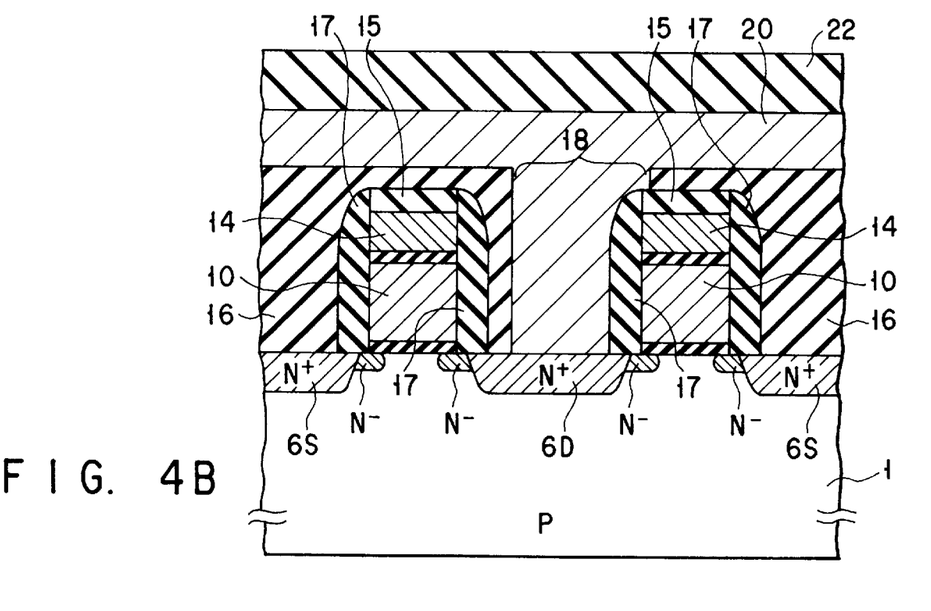
FIG. 4B is a sectional view showing a state wherein the contact hole is formed to overlap the control gate.

FIG. 4A is a sectional view showing a state wherein the contact hole 18 is formed to overlap the element isolation region 2, and FIG. 4B is a sectional view showing a state wherein the contact hole 18 is formed to overlap the control gate 14.

In the memory cell array shown in FIGS. 3A to 3C, even if the contact hole 18 is formed to overlap the element isolation region 2, as shown in FIG. 4A, the nitride film 5 and the side wall nitride film 7 can be used as an etching barrier to prevent etching of the element isolation region 2. This is because the material of the interlevel insulating film 16 is different from that of the nitride film 5 and the side wall nitride film 7, so that sufficient etching selectivity can be ensured between the interlevel insulating film 16 and the nitride films 5 and 7. Therefore, the substrate 1 is not exposed in the contact hole 18 to prevent short-circuiting of a bit line 20 with the substrate 1.

Even if the contact hole 18 is formed to overlap the control gate 14, as shown in FIG. 4B, the nitride film 15 and the side wall nitride film 17 can be similarly used as an etching barrier to prevent exposure of the control gate 14 and the floating gate 10 in the contact hole 18. Therefore, the bit line 20 does not short-circuit with the control and floating gates 14 and 10.

Reference numeral 22 in FIGS. 4A and 4B denotes an interlevel insulating film which insulates bit lines 20 from each other.

In the EEPROM according to this embodiment, the contact hole 18 can be arranged without any margin in the X direction (margin for the control gate 14) and the Y direction (margin for the element isolation region 2), thereby achieving a further shrink in design geometries of the memory cell array.

A method of manufacturing the EEPROM according to this embodiment will be described below.

Figure 5A:
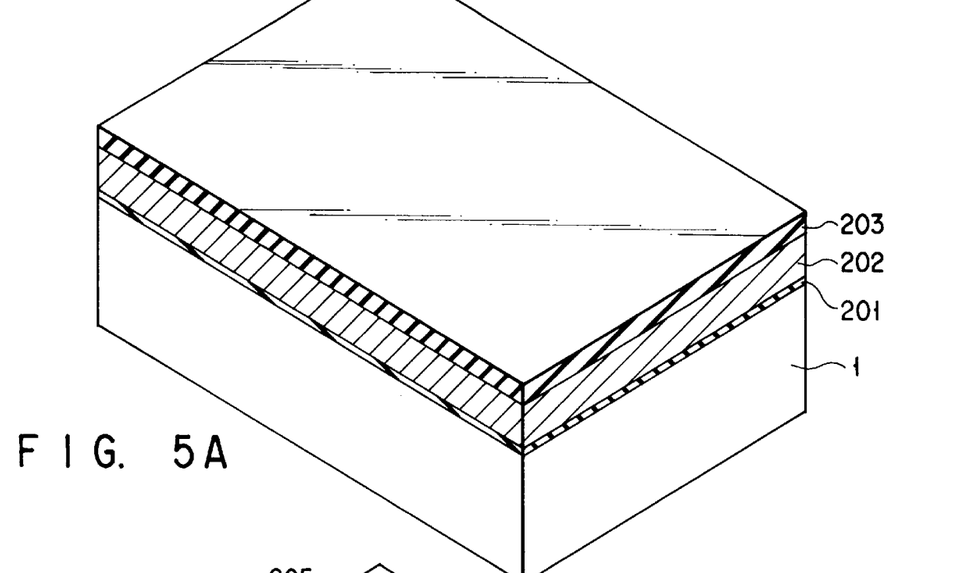
FIGS. 5A to 5R are perspective views, respectively, showing the main steps of manufacturing an EEPROM according to the embodiment of the present invention.
Figure 5B:
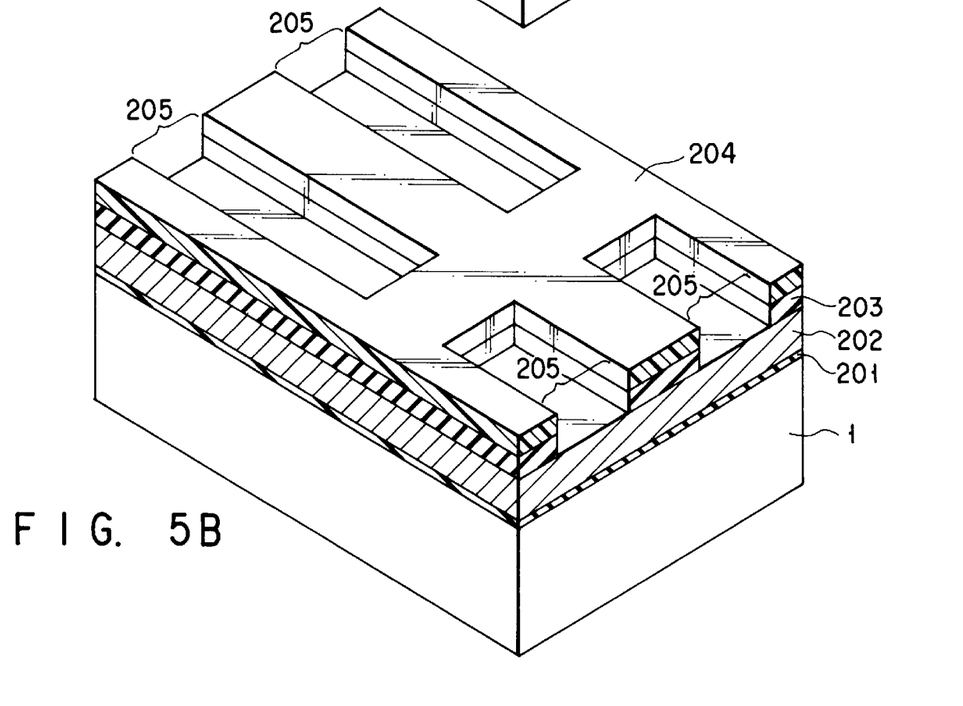
Figures 5C, 5D:
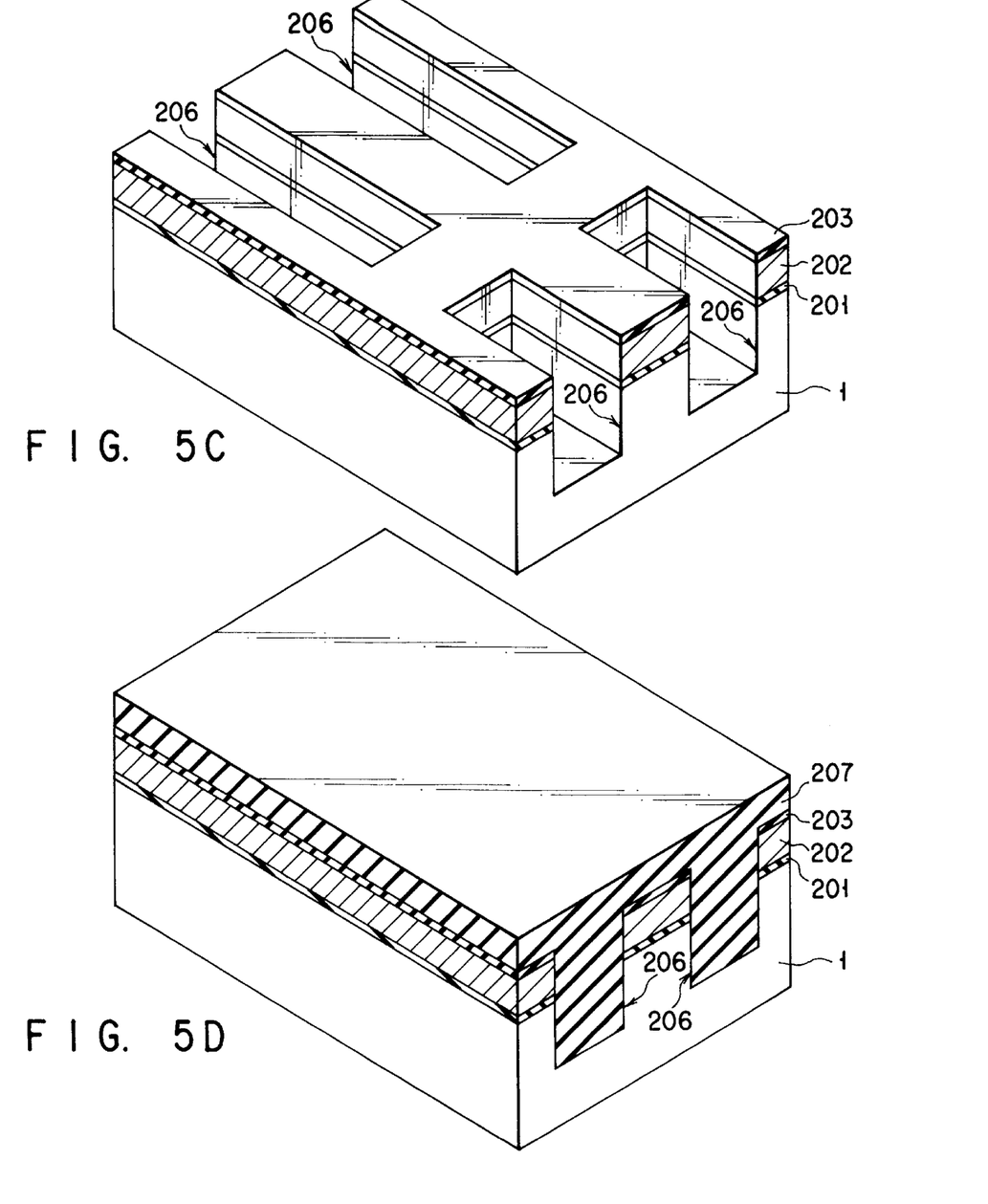
Figures 5E, 5F:
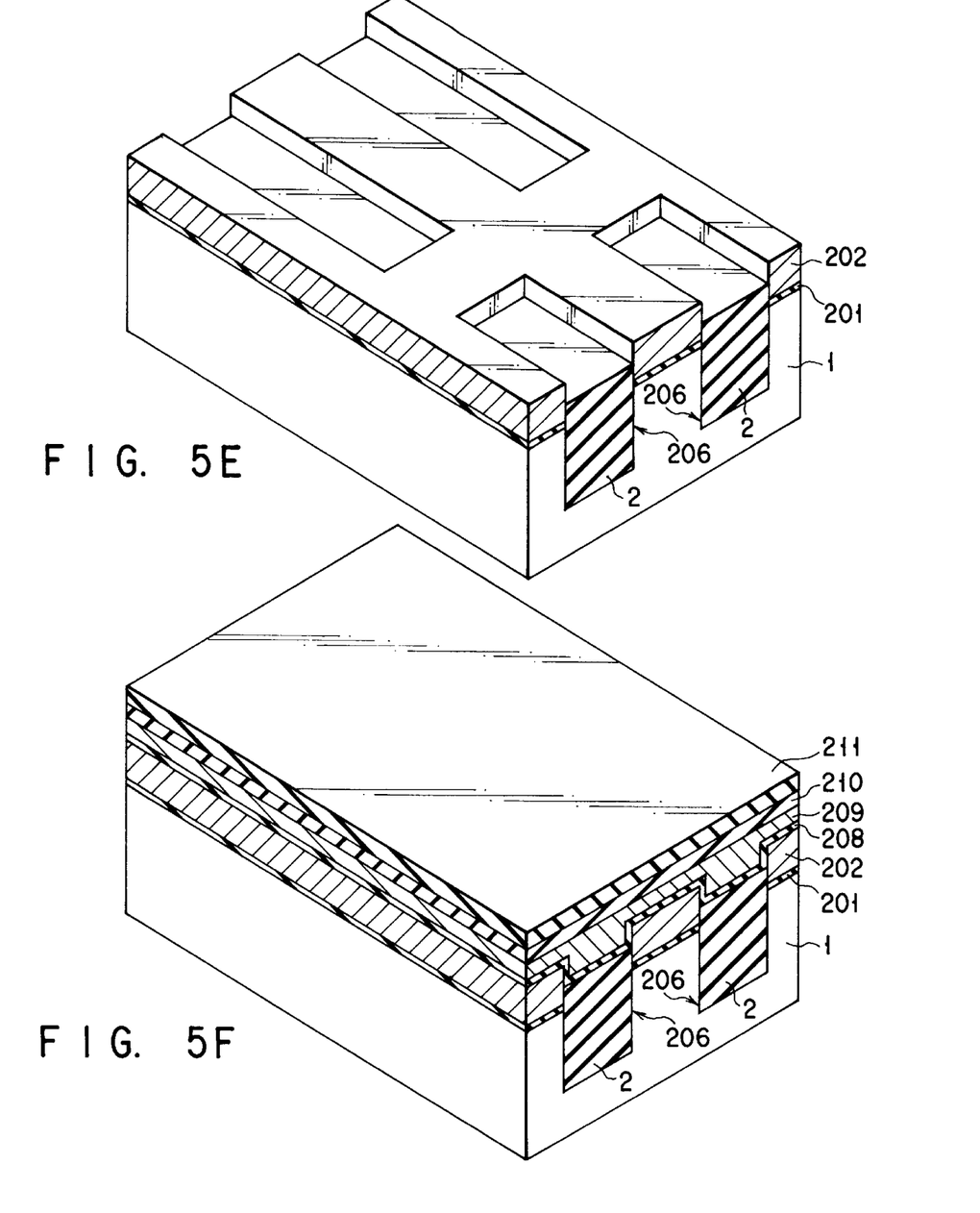
Figure 5G:
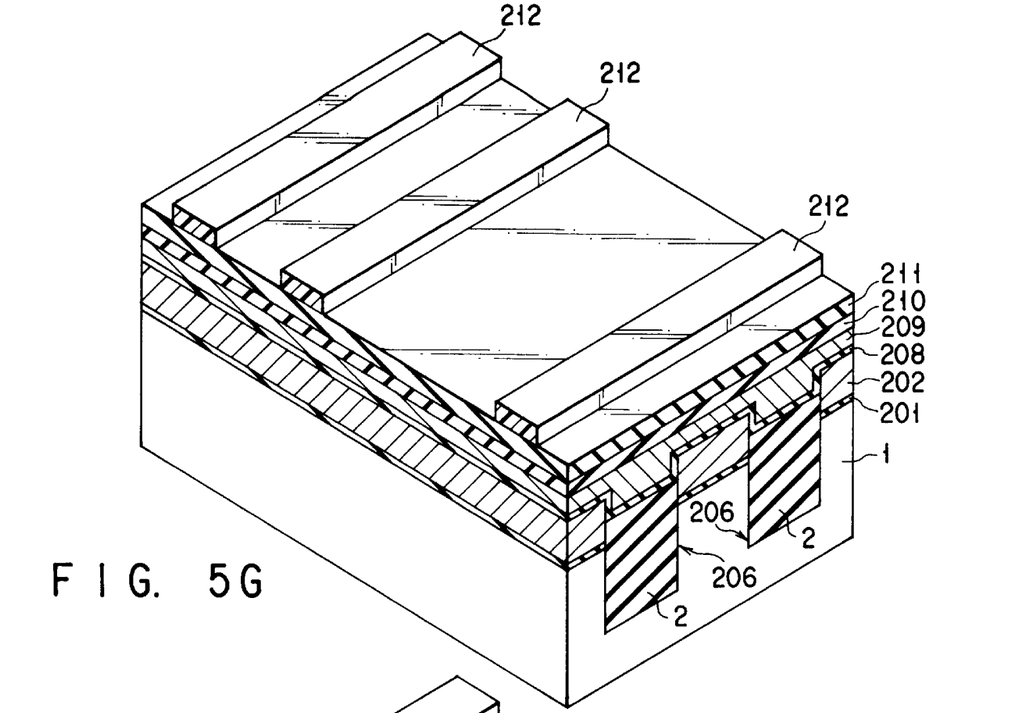
Figure 5H:
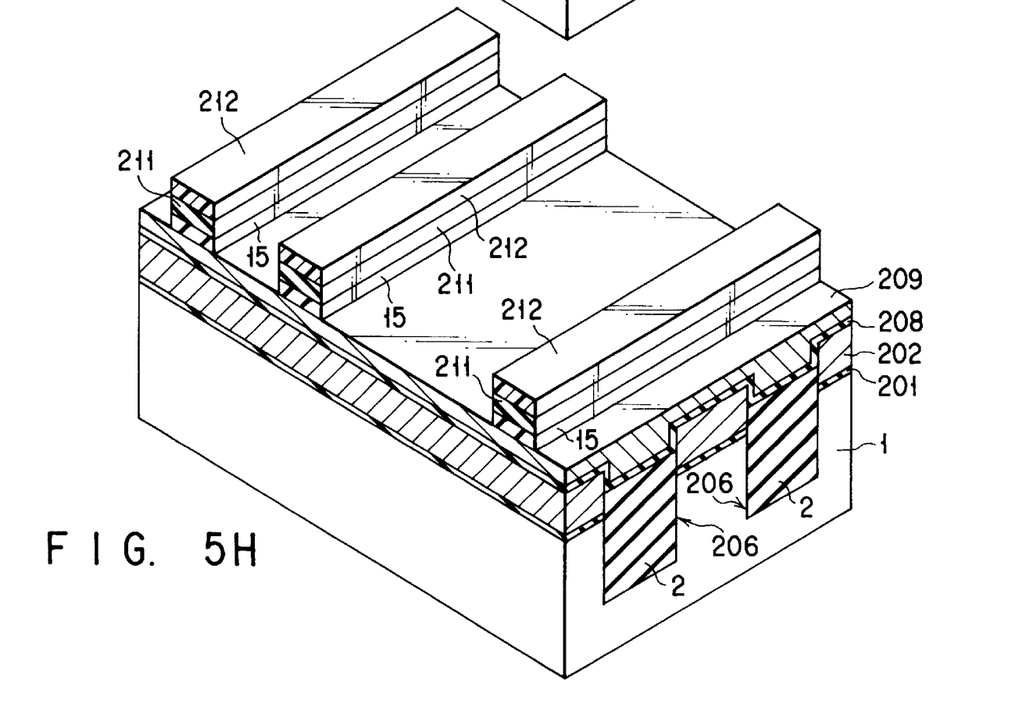
Figures 5I, 5J:
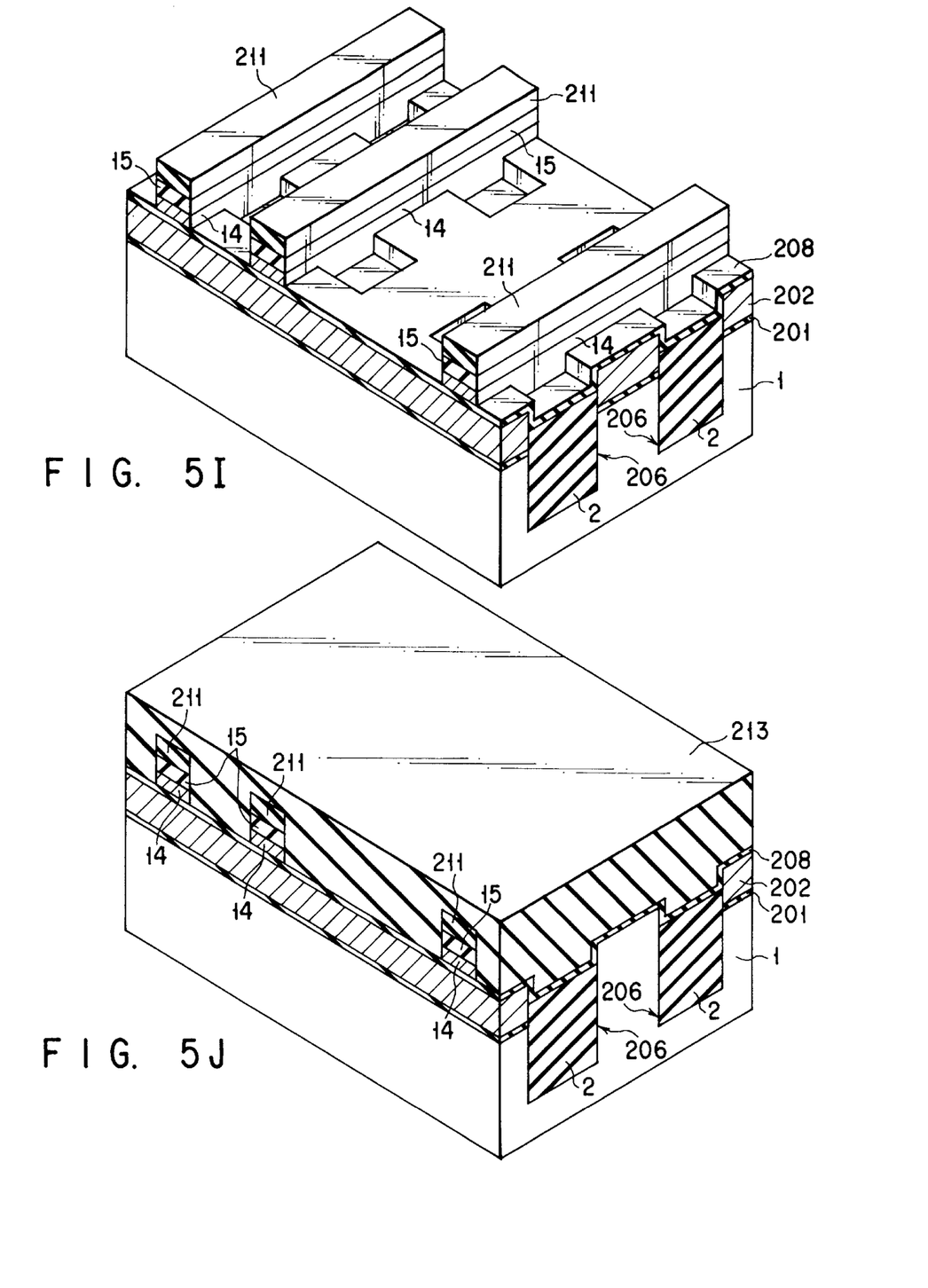
Figure 5K:
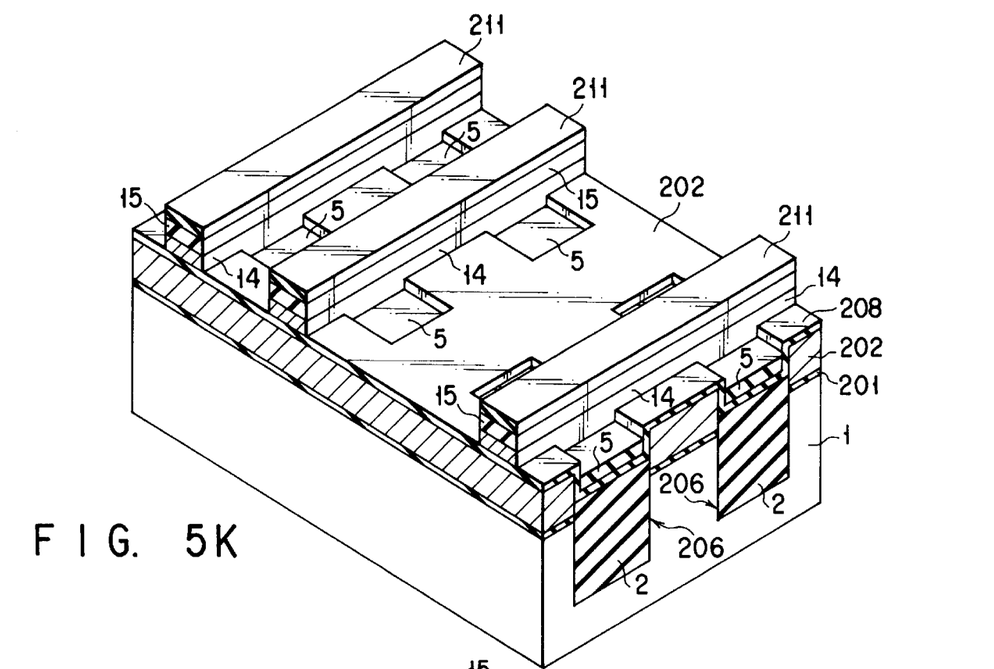
Figure 5L:
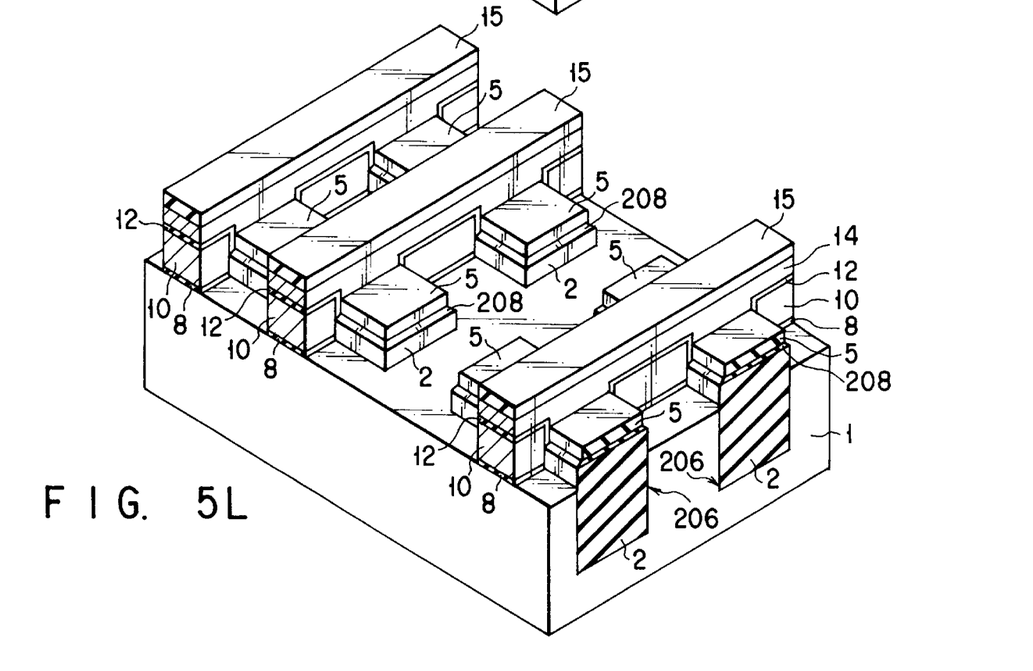
Figure 5M:
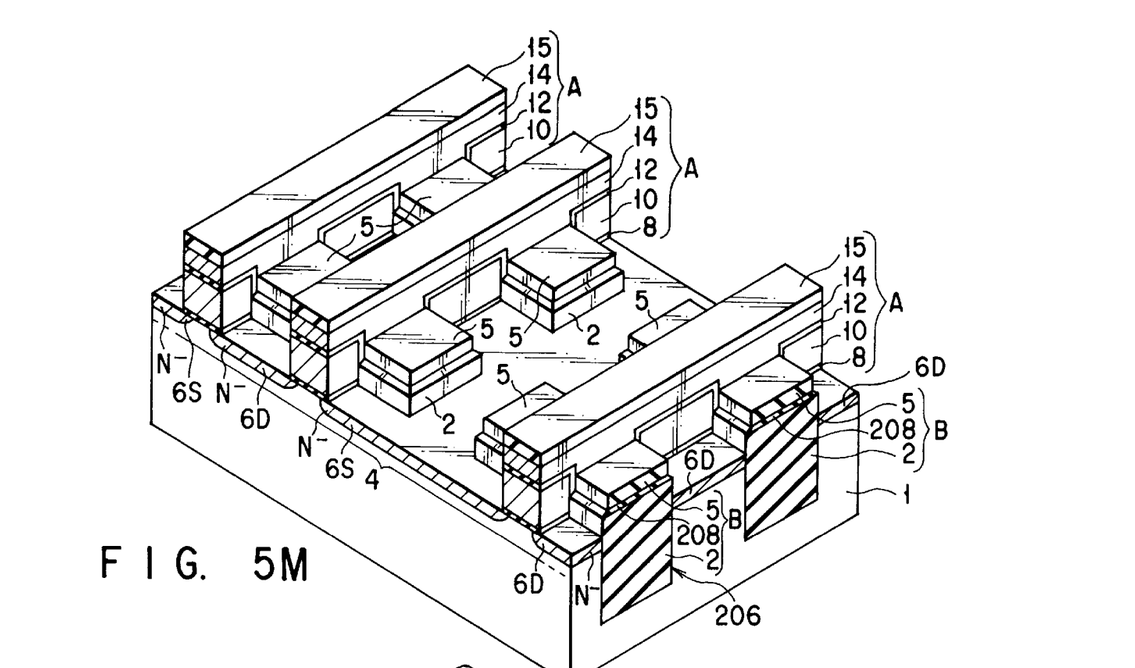
Figure 5N:
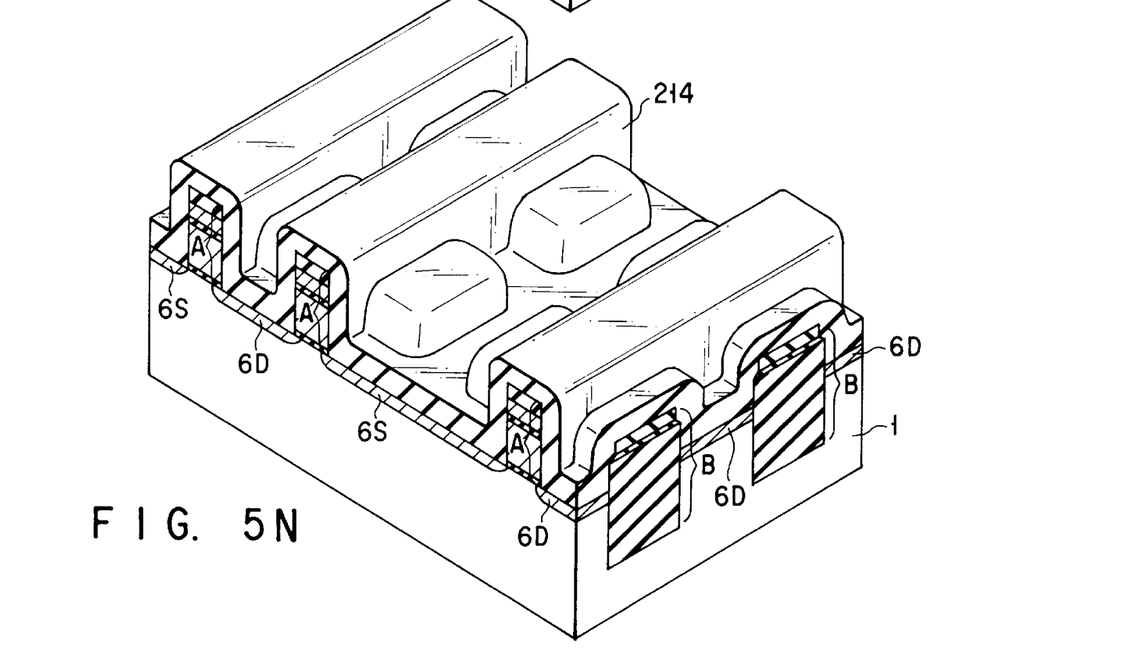
Figure 5O:
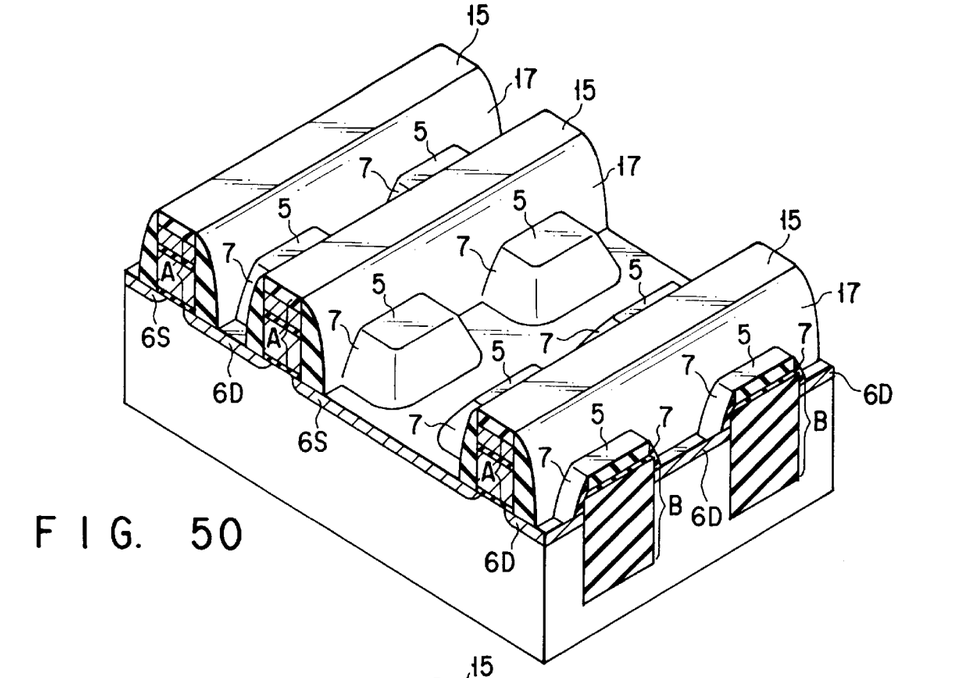
Figure 5P:
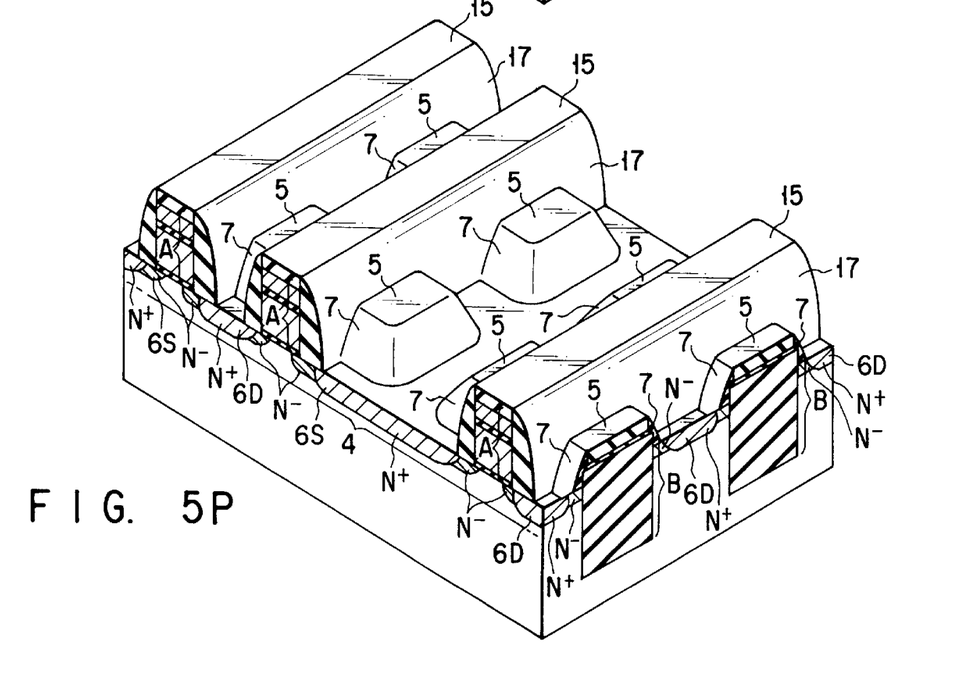
Figure 5Q:
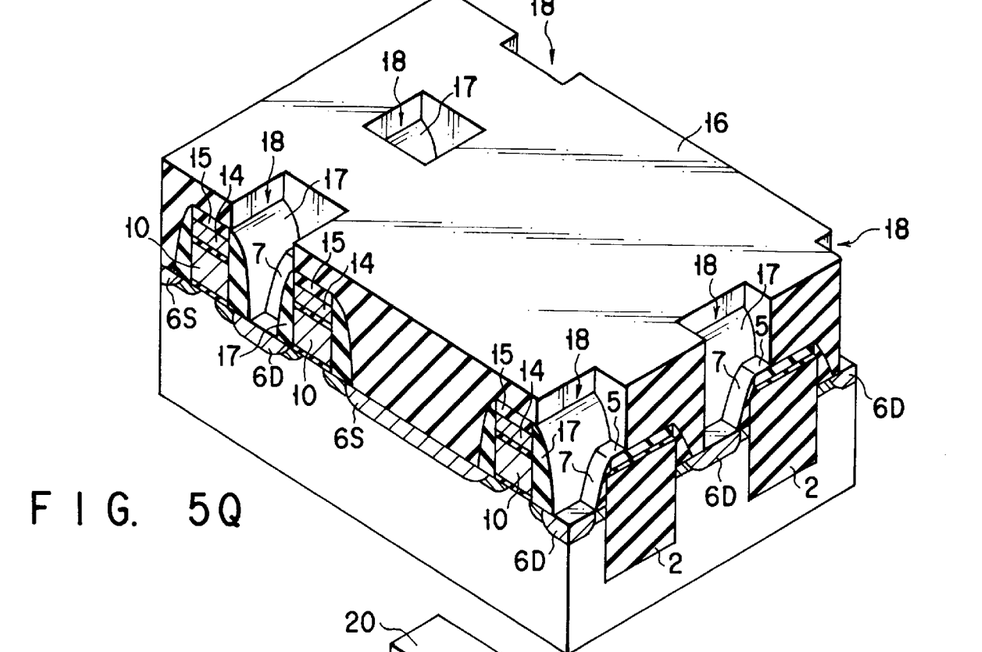
Figure 5R:
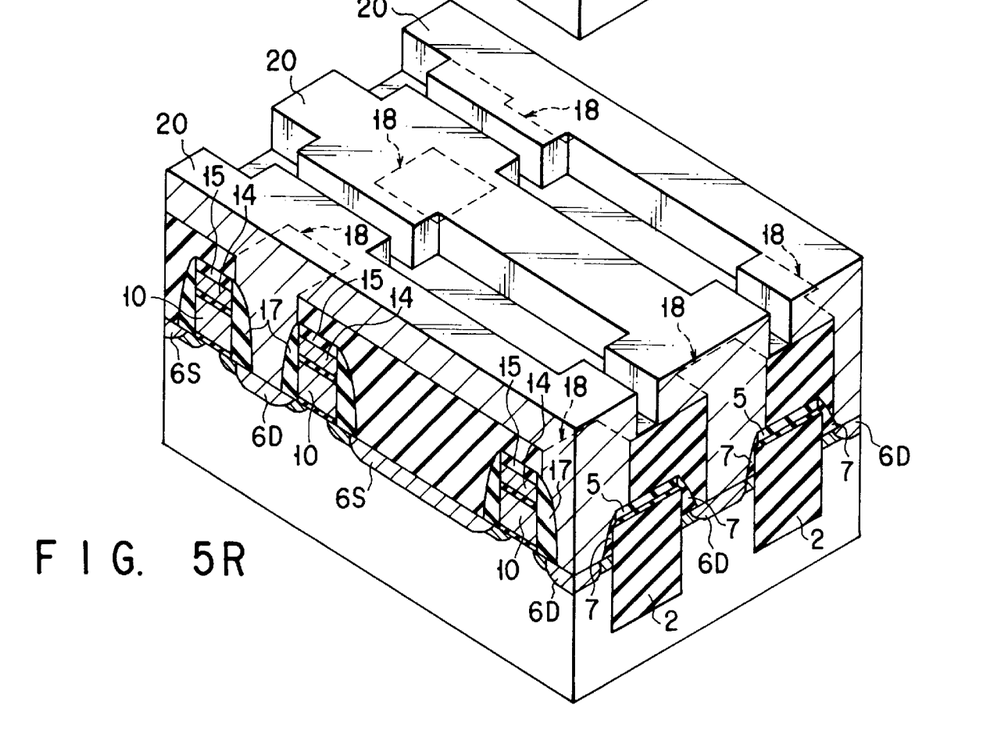

FIGS. 5A to 5R are perspective views, respectively, showing the main steps of the EEPROM according this embodiment.

As shown in FIG. 5A, a first gate oxide film ($SiO_2$) 201 is formed on the surface of a p-type silicon substrate 1. Silicon is deposited on the first gate oxide film 201 to form a first polysilicon film 202. The first polysilicon film 202 is used for a floating gate. TEOS-based $SiO_2$ is deposited on the polysilicon film 202 to form a CVD-$SiO_2$ film 203.

As shown in FIG. 5B, a photoresist is applied on the CVD-$SiO_2$ film 203 to form a photoresist film 204. Windows 205 are formed in the photoresist film 204 by photolithography. Each window 205 is formed in correspondence with a prospective element isolation region. The CVD-$SiO_2$ film 203 is etched using the photoresist film 204 as a mask.

As shown in FIG. 5C, the photoresist film 204 is removed. The first polysilicon film 202 and the first gate oxide film 201 are etched using the CVD-$SiO_2$ film 203 as a mask. Further, the substrate 1 is etched to form trenches 206 each having a desired depth in the substrate 1.

As shown in FIG. 5D, TEOS-based $SiO_2$ is deposited on the structure shown in FIG. 5C to form a CVD-$SiO_2$ film 207. The CVD-$SiO_2$ film 207 fills and planarizes the trenches of the structure shown in FIG. 5C.

As shown in FIG. 5E, the CVD-$SiO_2$ film 207 is etched back to leave TEOS-based $SiO_2$ in only the recessed portions of the structure shown in FIG. 5C. As a result, element isolation regions 2 are formed. Since the CVD-$SiO_2$ film 203 is made from the same material as that of the CVD-$SiO_2$ film 207, the CVD-$SiO_2$ film 203 is etched at the same time as the CVD-$SiO_2$ film 207.

As shown in FIG. 5F, a multilayered film made from silicon dioxide ($SiO_2$)/silicon nitride ($Si_3N_4$)/silicon dioxide ($SiO_2$) is formed on the structure shown in FIG. 5E to form an insulating film 208. The insulating film 208 serves to insulate the floating gate from the control gate. Silicon is deposited on the insulating film 208 to form a second polysilicon film 209. The second polysilicon film 209 is used for a control gate. Silicon nitride ($Si_3N_4$) is deposited on the second polysilicon film 209 to form a nitride film 210. Silicon dioxide ($SiO_2$) is deposited on the nitride film 210 to form a CVD-$SiO_2$ film 211.

As shown in FIG. 5G, a photoresist is applied on the CVD-$SiO_2$ film 211 to form a photoresist film 212. The photoresist film 212 is patterned by photolithography into a pattern corresponding to a control gate (word line).

As shown in FIG. 5H, the CVD-$SiO_2$ film 211 and the nitride film 210 are etched using the photoresist film 212 as a mask, thereby forming nitride films 15 each covering the upper surface of the control gate (word line).

As shown in FIG. 5I, the photoresist film 212 is removed. The second polysilicon film 209 is etched using the CVD-$SiO_2$ film 211 as a mask, thereby forming control gates (word lines) 14.

As shown in FIG. 5J, silicon nitride ($Si_3N_4$) is deposited on the structure shown in FIG. 5I to form a nitride film 213. The nitride film 213 fills and planarizes the level differences of the structure shown in FIG. 5I.

As shown in FIG. 5K, the nitride film 213 is etched back to leave silicon nitride in only recessed portions surrounded by the first polysilicon films 202, control gates 14 and the second polysilicon films 209 in the structure shown in FIG. 5I. As a result, nitride films 5 each covering the upper surface of the element isolation region 2 are formed.

As shown in FIG. 5L, the insulating film 208 is etched. Since the CVD-$SiO_2$ film 211 is made from the same material as that of the insulating film 208, the CVD-$SiO_2$ film 211 is etched at the same time when the insulating film 208 formed on the side wall of the first polysilicon film 202 is over-etched. The first polysilicon film 202 and the first gate oxide film 201 are etched to form a tunnel insulating film 8, a floating gate 10, and an insulating film 12 which insulates the floating gate 10 from the control gate 14. The first polysilicon film 202 and the first gate oxide film 201 are etched using the nitride film 5 (particularly after the CVD-$SiO_2$ film 211 is removed) and the nitride film 15 as a mask. The insulating film 208 is left between the element isolation region 2 and the nitride film 5.

As shown in FIG. 5M, an n-type impurity is ion-implanted in the element region 4 of the substrate 1 by using, as a mask, a linear structure A including the tunnel insulating film 8, the floating gate 10, the insulating film 12, the control gate 14, and the nitride film 15, and an island-like structure B including the element isolation region 2, the insulating film 208, and the nitride film 5. As a consequence, of the n-type source and drain regions 6S and 6D, a lightly doped $n^-$-type region is formed.

As shown in FIG. 5N, silicon nitride ($Si_3N_4$) is deposited on the structure shown in FIG. 5M to form a nitride film 214. The nitride film 214 covers the surface of the linear structure A, the surface of the island-like structure B, and the exposed surface of the substrate 1.

As shown in FIG. 5O, the nitride film 214 is etched back to leave silicon nitride on the side walls of the linear and island-like structures A and B. With this process, a side wall nitride film 17 is formed on the side wall of the linear structure A, while a side wall nitride film 7 is formed on the side wall of the island-like structure B.

As shown in FIG. 5P, an n-type impurity is ion-implanted in the element region 4 of the substrate 1 by using, as a mask, the linear structure A, the side wall nitride film 17, the island-like structure B, and the side wall nitride film 7. Then, of the n-type source and drain regions 6S and 6D, a heavily doped $n^+$-type region is formed.

As shown in FIG. 5Q, silicon dioxide ($SiO_2$) is deposited on the structure shown in FIG. 5P to form an interlevel insulating film 16. A photoresist film (not shown) is formed on the interlevel insulating film 16, and windows corresponding to a contact hole opening pattern are formed in the photoresist film. Using the photoresist film (not shown) as a mask, the interlevel insulating film 16 is etched with an etchant having a high silicon dioxide etching rate and a low etching rate for silicon nitride, thereby forming contact holes 18 each reaching the n-type drain region 6D. At this time, even if the contact hole 18 is formed to overlap one or both of the element isolation region 2 and the control gate 14, as shown in FIGS. 4A and 4B, etching of the element isolation region 2 is suppressed by the nitride film 5, the side wall nitride film 7, the nitride film 15, and the side wall nitride film 17.

As shown in FIG. 5R, a low-resistance conductive metal such as aluminum is deposited on the structure shown in FIG. 5Q to form a low-resistance metal film. A photoresist film (not shown) is formed on the low-resistance metal film, and patterned into a pattern corresponding to bit lines. Using the photoresist film (not shown) as a mask, the low-resistance metal film is etched to form bit lines 20 each connected to the drain region 6D via the contact hole 18. Thereafter, an interlevel insulating film (not shown) is formed to cover the bit line 20 and the interlevel insulating film 16.

According to the above manufacturing method, an EEPROM having the structure shown in FIGS. 3A to 3C can be manufactured.

The EEPROM and its manufacturing method according to this embodiment include an arrangement useful for a semiconductor device other than the EEPROM, and its manufacturing method.

First, the film (nitride film 5) capable of suppressing etching of the element isolation region 2 in forming the contact hole is formed on or above the element isolation region 2. With this arrangement, a short mode which occurs along with the progress of shallowing of the diffusion layer (drain region 6D) can be prevented.

Second, the film (nitride film 5) capable of preventing the short mode can be formed on or above the element isolation region 2 in self-alignment.

As shown in FIG. 5B, the polysilicon film 202, and a mask pattern for forming the trench 206, i.e., the CVD-$SiO_2$ film 203 are formed on the silicon substrate 1. As shown in FIG. 5C, using the CVD-$SiO_2$ film 203 as a mask, the substrate 1 is etched with an etchant having a high silicon etching rate and a low silicon dioxide etching rate, thereby forming the trench 206. As shown in FIG. 5D, the trench 206 is filled with an insulator, i.e., the CVD-$SiO_2$ film 207. As shown in FIG. 5E, the CVD-$SiO_2$ film 207 is etched back with an etchant having a high silicon dioxide etching rate and a low silicon etching rate. With this processing, the upper surface of the polysilicon film 202 is made to project from the upper surface of the CVD-$SiO_2$ film 207. In this manner, the CVD-$SiO_2$ film 207, i.e., a recess corresponding to the upper surface of the element isolation region 2 is formed. As shown in FIG. 5K, this recess is filled with silicon nitride to obtain the nitride film 5 in self-alignment with the upper surface of the element isolation region 2.

As has been described above, according to the present invention, a semiconductor device in which a short mode that occurs when the contact hole 18 overlaps the element isolation region 2 can be prevented without setting any margin between the contact hole 18 and the element isolation region 2, a method of manufacturing the same, a nonvolatile semiconductor memory device having a memory cell array in which the contact hole 18 can be arranged without any margin in the X and Y directions, thereby promoting a shrink in design geometries and a method of manufacturing the same can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor device comprising:
   an element isolation region which is formed in a semiconductor substrate, isolates an element region in said substrate, said element isolation region being made from a first insulator;
   a semiconductor active region formed in said element region;
   a second insulator which covers a surface of said first insulator, covers the exposed surface of said element isolation region, and is made from an insulating material different from said first insulator;
   an interlevel insulating film formed over said second insulator and said semiconductor active region, said interlevel insulating film being made from a third insulator formed from an insulating material different from said second insulator;
   an opening hole formed in said interlevel insulating film to expose said semiconductor active region and said second insulator therein; and
   an interconnect formed on said interlevel insulating film to be electrically connected to said semiconductor active region through the opening.

2. A device according to claim 1, wherein said first and third insulators are a silicon oxide-based insulator, and said second insulator is a silicon nitride-based insulator.

3. A device according to claim 1, wherein said element isolation region is a trench type element isolation region.

4. A device according to claim 3, wherein said trench type element isolation region projects from said element region, and said second insulator has an upper portion covering an upper surface of said trench type element isolation region and a side portion covering a side surface of said trench type element isolation region.

5. A device according to claim 4, wherein said semiconductor active region comprises a lightly doped region having a low impurity concentration formed at a portion below said side portion of said second insulator, and a heavily doped region having a high impurity concentration formed at a portion exposed in the opening hole.

6. A semiconductor device comprising:
   an element isolation region which is formed in a semiconductor substrate, has at least first and second portions parallel to each other, and isolates an element region in said substrate between said first and second portions, said element isolation region being made from a first insulator;
   a semiconductor active region formed in said element region;
   first and second gate electrodes extending substantially parallel to each other in a direction to cross said first and second portions of said element isolation region, and formed over said element region to be insulated from said element region;
   a second insulator which covers an exposed surface of said first insulator, and is made from an insulating material different from said first insulator;
   a third insulator covering surfaces of said first and second gate electrodes and made from an insulating material different from said first insulator;
   an interlevel insulating film formed over said second insulator, said third insulator and said semiconductor active region, said interlevel insulating film being made from a fourth insulator formed from an insulating material different from said second insulator, said third insulator;
   an opening hole formed in said interlevel insulating film to expose said semiconductor active region said second insulator and said third insulator therein; and
   an interconnect formed on said interlevel insulating film to be electrically connected to said semiconductor active region through the opening hole.

7. A device according to claim 6, wherein said third insulator is the same insulator as said second insulator.

8. A device according to claim 6, wherein said first and fourth insulators are a silicon oxide-based insulator, and said second and insulators are a silicon nitride-based insulator.

9. A device according to claim 6, wherein said element isolation region is of a trench type, and said first and second portions of said trench type element isolation region project from said element region.

10. A device according to claim 9, wherein said second insulator comprises an upper surface portion covering upper surfaces of said first and second portions of said element isolation region, and a side surface portion covering side surfaces of said first and second portion of said element isolation region, and
   said third insulator comprises an upper surface portion covering upper surfaces of said first and second gate electrodes, and a side surface portion covering side surfaces of said first and second gate electrodes.

11. A device according to claim 10, wherein said semiconductor active region comprises a lightly doped region having a low impurity concentration formed below said side surface portions of said second and third insulators, and a heavily doped region having a high impurity concentration formed at a portion exposed in the opening hole.

12. A device according to claim 6, further comprising:
   a first charge accumulation layer formed between said first gate electrode and said element region; and
   a second charge accumulation layer formed between said second gate electrode and said element region.

13. A device according to claim 12, wherein said first and second gate electrodes are control gates,
   said first and second charge accumulation layers are floating gates, and
   said interconnect is a bit line.

14. A device according to claim 12, wherein said third insulator is the same insulator as said second insulator.

15. A device according to claim 12, wherein said first and fourth insulators are a silicon oxide-based insulator, and said second and third insulators are a silicon nitride-based insulator.

16. A device according to claim 12, wherein said element isolation region is of a trench type, and said first and second portions of said trench type element isolation region project from said element region.

17. A device according to claim 16, wherein said second insulator comprises an upper surface portion covering upper surfaces of said first and second portions of said element isolation region, and a side surface portion covering side surfaces of said first and second portions of said element isolation region, and said third insulator comprises an upper surface portion covering upper surfaces of said first and second gate electrodes, and a side surface portion covering side surfaces of said first and second gate electrodes.

18. A device according to claim 17, wherein said semiconductor active region comprises a lightly doped region having a low impurity concentration formed below said side surface portions of said second and third insulators, and a heavily doped region having a high impurity concentration formed at a portion exposed in the opening hole.

19. A semiconductor device comprising:

an element isolation region, which is formed in a semiconductor substrate, isolates an element region in said substrate, said element isolation region being made from a first insulator;

a source region formed in said element region;

a drain region formed in said element region;

a second insulator formed on said element region between said source region and a drain region;

a floating gate formed on said second insulator;

a third insulator formed on said floating gate and on one part of said element isolation region;

a control gate formed on said third insulator on said floating gate and on one part of said element isloation region;

a fourth insulator formed on the exposed surface of said third insulator, and is made from an insulating material different from said first insulator;

a fifth insulator formed over at least said floating gate, said third insulator and said control gate, and is made from an insulating material different from said first insulator; and, a sixth insulator formed over said fourth and fifth insulators, said source region and said drain region, and is made from an insulating material different from said fourth and fifth insulators.

20. A device according to claim 19, wherein said first and sixth insulators are a silicon oxide-based insulators and said fourth and fifth insulators are silicon nitride-based insulators.

21. A device according to claim 19, further comprising:

an opening hole formed in said sixth insulator to expose one of said source and drain regions therein;

an interconnect formed on said sixth insulator to be electrically connected to one of said source and drain regions, through said opening hole.

22. A device according to claim 21, wherein at least one of said fourth and fifth insulators are exposed from said opening hole.

23. A device according to claim 21, wherein said source and drain regions comprise a lightly doped region having a low impurity concentration formed at a portion below said side portion of said fourth insulator and said fifth insulator, and a heavily doped region having a high impurity concentration formed at a portion exposed in said opening hole.

24. A device according to claim 19, wherein said element isolation region is a trench type element isolation region.

25. A device according to claim 24, wherein said trench type element isolation regions projects from said element region, and said fourth insulator has an upper portion covering an upper surface of said trench type element isolation region and a side portion covering a side surface of said trench type element isolation region.

26. A device according to claim 25, further comprising:

an opening hold formed in said sixth insulator to expose one of said source and drain regions therein;

an interconnect formed on said sixth insulator to be electrically connected to one of said source and drain regions through said opening hole.

27. A device according to claim 26, wherein at least one of said fourth and fifth insulators are exposed from said opening hole.

28. A device according to claim 27, wherein said source and drain regions comprise a lightly doped region having a low impurity concentration formed at a portion below said side portion of said fourth insulator and said fifth insulator, and a heavily doped region having a high impurity concentration formed at a portion exposed in said opening hole.

29. A device according to claim 19, wherein said element region extends in a first direction and said control gate extends in a second direction to cross said first direction.

* * * * *